(12) United States Patent
Aitken et al.

(10) Patent No.: US 7,064,414 B2
(45) Date of Patent: Jun. 20, 2006

(54) HEATER FOR ANNEALING TRAPPED CHARGE IN A SEMICONDUCTOR DEVICE

(75) Inventors: John M Aitken, South Burlington, VT (US); Ethan H. Cannon, Essex Junction, VT (US); Philip J. Oldiges, Lagrangeville, NY (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,483

(22) Filed: Nov. 12, 2004

(65) Prior Publication Data

US 2006/0103007 A1    May 18, 2006

(51) Int. Cl.
*H01L 29/00*    (2006.01)
(52) U.S. Cl. .................. 257/537; 257/538; 257/467; 257/468; 257/350; 257/380; 257/499; 257/543; 257/508; 257/547; 438/381; 438/382; 438/383; 438/402; 438/412
(58) Field of Classification Search ............... 257/536, 257/537, 538, 467, 468, 469, 350, 380, 499, 257/543, 508, 547; 438/381–3, 402, 412
See application file for complete search history.

(56) References Cited

U.S. PATENT DOCUMENTS

| 4,091,527 | A | 5/1978 | Goodman et al. |
| 6,111,280 | A | 8/2000 | Gardner et al. |
| 6,171,880 | B1 | 1/2001 | Gaitan et al. |
| 6,395,587 | B1 | 5/2002 | Crowder et al. |
| 6,734,076 | B1 * | 5/2004 | Jaiswal et al. .............. 438/384 |
| 2003/0027411 | A1 * | 2/2003 | Kanai ......................... 438/506 |
| 2003/0119289 | A1 | 6/2003 | Bryant |
| 2004/0000691 | A1 | 1/2004 | Wieczorek et al. |

FOREIGN PATENT DOCUMENTS

JP          10163218          6/1998

OTHER PUBLICATIONS

A New Integrated Test Structure for On-Chip Post-Irradiation Annealing in MOS Devices, by C. Chabrerie et al., appearing in *Nuclear Science, IEEE Transactions on*, vol. 45, Issue 3, published Jun. 1998, In Cannes, France, one page.
Investigation of On-Chip High Temperature Annealing of PMOS Dosimeters, by A. Kellcher et al., appearing in *Nuclear Science, IEEE Transactions on*, vol. 43, Issue 3, published Jun., 1996, in Arcaehon, France, one page.

* cited by examiner

*Primary Examiner*—Matthew Smith
*Assistant Examiner*—John M. Parker
(74) *Attorney, Agent, or Firm*—Schmeiser, Olsen & Watts; Anthony Canale

(57) ABSTRACT

A structure and associated method for annealing a trapped charge from a semiconductor device. The semiconductor structure comprises a substrate and a first heating element. The substrate comprises a bulk layer, an insulator layer and a device layer. The first heating element is formed within the bulk layer. A first side of the first heating element is adjacent to a first portion of the insulator layer. The first heating element is adapted to be selectively activated to generate thermal energy to heat the first portion of the insulator layer and anneal a trapped electrical charge from the first portion of the insulator layer.

29 Claims, 6 Drawing Sheets

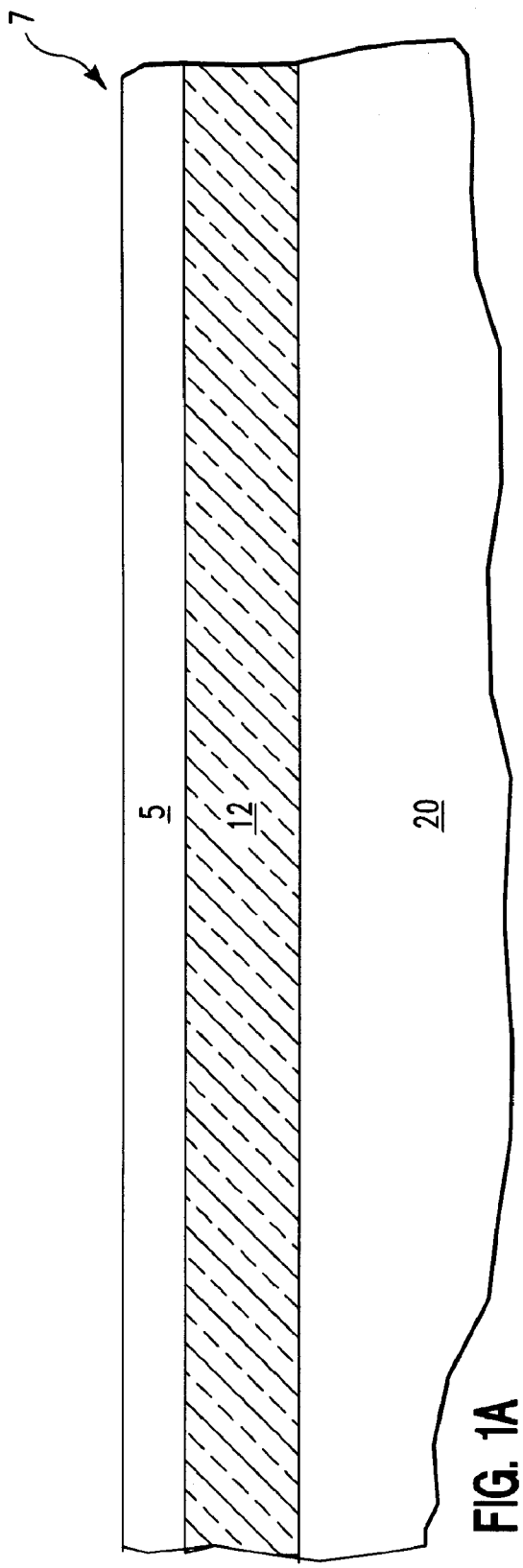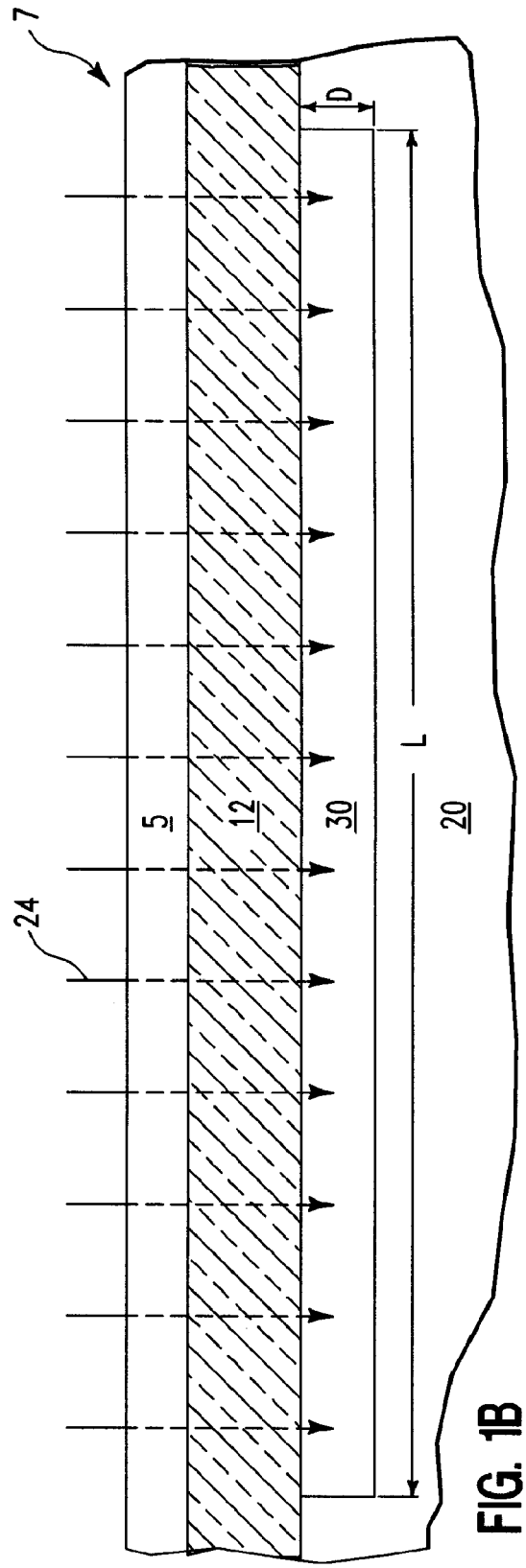

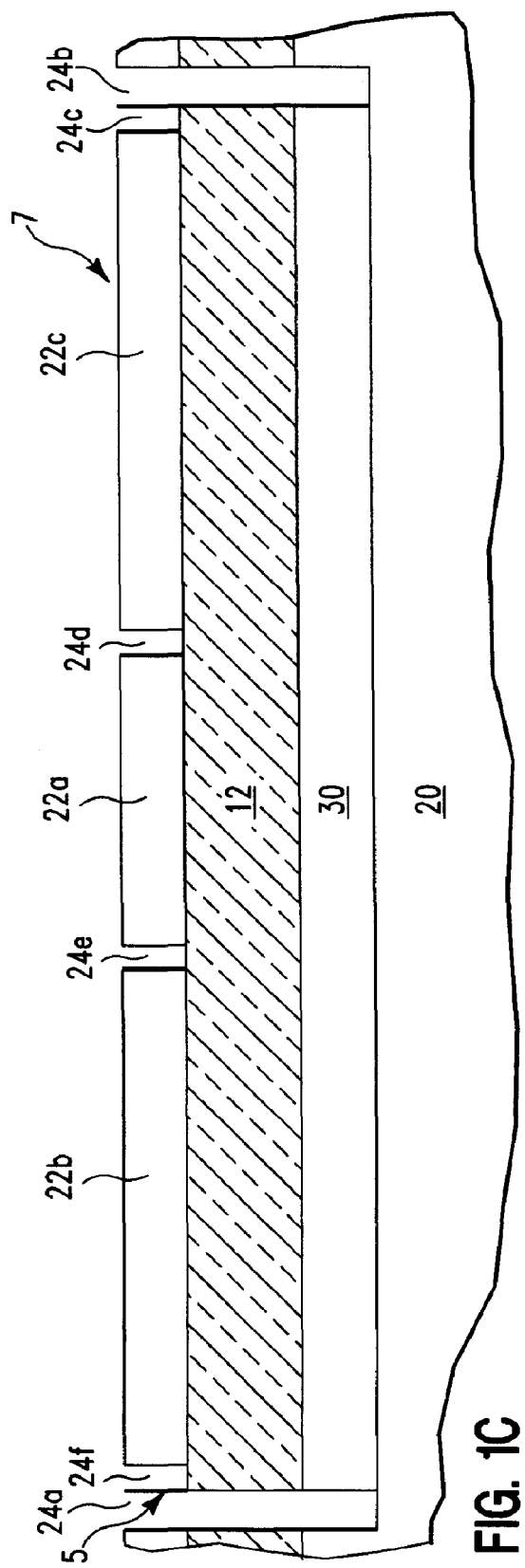
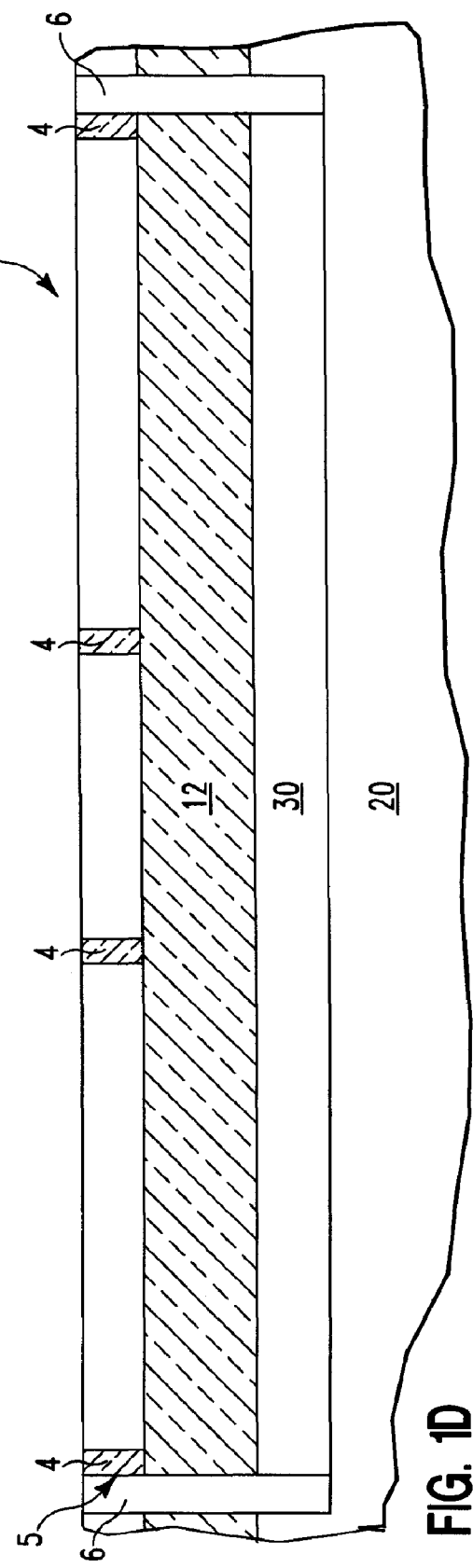

US 7,064,414 B2

HEATER FOR ANNEALING TRAPPED CHARGE IN A SEMICONDUCTOR DEVICE

BACKGROUND OF THE INVENTION

1. Technical Field

The present invention relates to a structure and method to anneal a trapped charge from an insulator layer.

2. Related Art

Unwanted electrical charges in an electrical device may cause the electrical device to malfunction. Therefore there is a need for removing unwanted electrical charges from electrical devices.

SUMMARY OF THE INVENTION

The present invention provides a semiconductor structure comprising:

a substrate comprising a bulk layer, an insulator layer and a device layer; and a first heating element formed within the bulk layer, wherein a first side of the first heating element is adjacent to a first portion of the insulator layer, and wherein the first heating element is adapted to be selectively activated to generate thermal energy to heat said first portion of the insulator layer and anneal a trapped electrical charge from said first portion of the insulator layer.

The present invention provides method for forming a semiconductor structure comprising:

providing a substrate;

forming within the substrate, a bulk layer, an insulator layer and a device layer; and forming a first heating element within the bulk layer, wherein a first side of the first heating element is adjacent to a first portion of the insulator layer, and wherein the first heating element is adapted to be selectively activated to generate thermal energy to heat said first portion of the insulator layer and anneal a trapped electrical charge from said first portion of the insulator layer.

The present invention advantageously provides a system and associated method to remove unwanted electrical charges from electrical devices.

BRIEF DESCRIPTION OF THE DRAWINGS

FIG. 1A–1E illustrate a semiconductor structure forming method and structure comprising a heating element, in accordance with embodiments of the present invention.

DETAILED DESCRIPTION OF THE INVENTION

FIG. 1A–1E illustrate a cross sectional view of a forming method and structure for forming a semiconductor structure 2 comprising a heating element 30, in accordance with embodiments of the present invention. The forming method and structure for forming the semiconductor structure 2 of FIGS. 1A–1E also applies to the formation of semiconductor structures 32, 40, and 49 of FIGS. 2, 3, and 4.

Figure 1E:
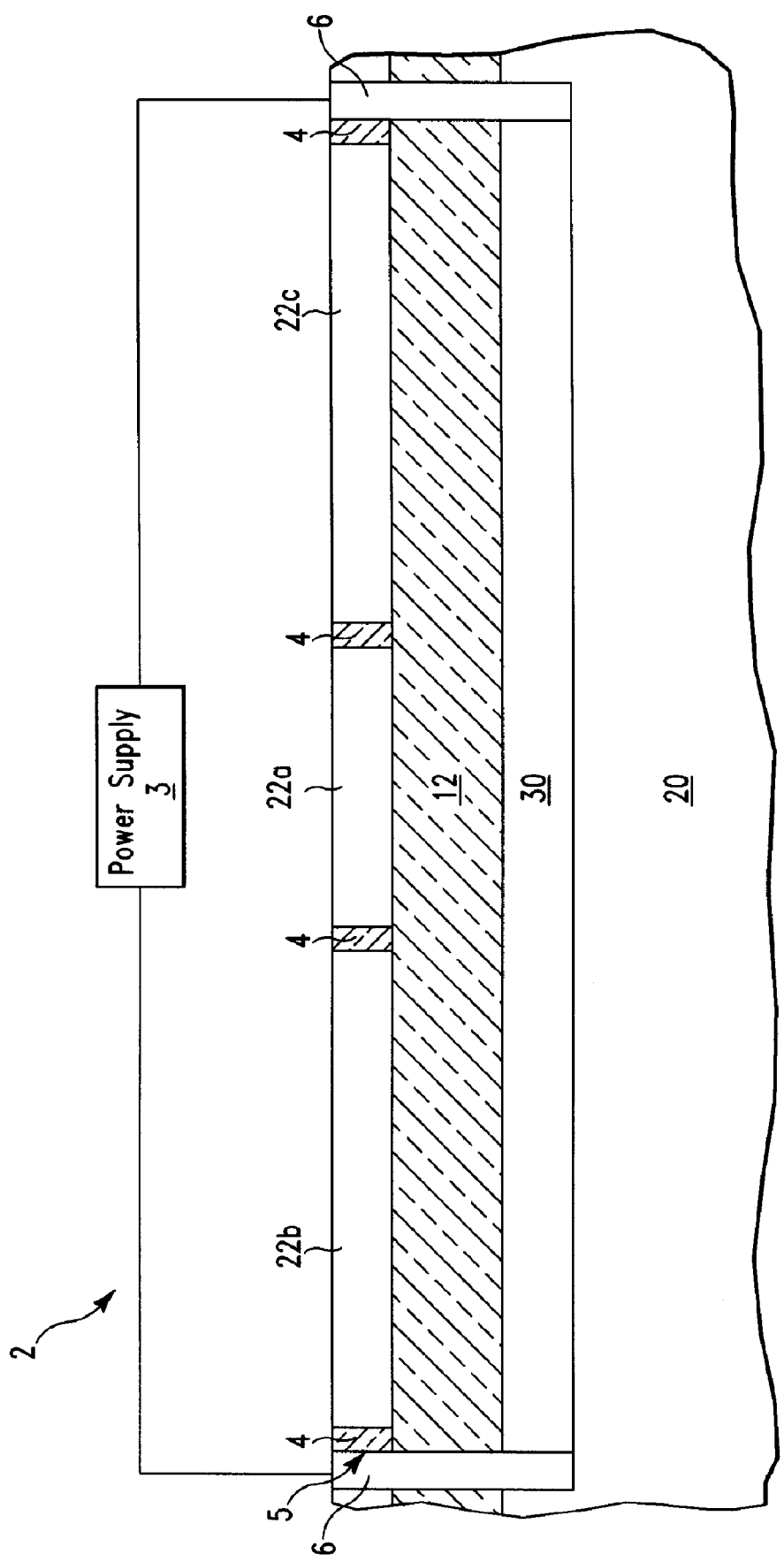

FIG. 1A illustrates a semiconductor substrate 7 processed to be a silicon on insulator (SOI) semiconductor structure 2 (e.g., sec semiconductor structure 2 of FIG. 1E), in accordance with embodiments of the present invention. The semiconductor substrate 7 may comprise silicon. The semiconductor substrate 7 comprises a bulk layer 20, an insulator layer 12, and a device layer 5. The semiconductor substrate 7 comprising the bulk layer, the insulator layer 12, and the device layer 5 may be formed by any method known to a person of ordinary skill in the art such as, inter alia, SIMOX, smart cut, deep oxygen implant, etc. The term "bulk layer" is defined heroin as a substrate located below the insulator layer 12. The bulk layer 20 may comprise, inter alia, crystalline silicon. The insulator layer 12 may comprise, inter alia, silicon dioxide, a thermally insulative nitride, an organic insulating material, etc. The insulator layer 12 comprising silicon dioxide may be, inter alia, a buried oxide layer (BOX), etc. The device layer 5 may comprise, inter alia, active silicon.

FIG. 1B illustrates the formation of a heating element 30 within the bulk layer 20 of the semiconductor substrate 7, in accordance with embodiments of the present invention. The heating element 30 may comprise a resistor (e.g., a diffusion resistor) formed by implanting ion implants 24 into the bulk layer 20. The ion implants 24 may comprise, inter alia, N-type dopants, such as, inter alia phosphorus or arsenic. Alternatively, ion implants 24 may comprise, inter alia, P-type dopants, such as, inter alia, boron. The heating element 30 must be annealed in order to activate the implanted heater dopants (e.g., N-type dopants, P-type dopants, etc.) thereby creating a resistor. The heating element 30 may comprise a length L of about 1 um to about 10 um. The heating element 30 may comprise a depth D of about 0.1 um to about 0.2 mm. The heating element 30 may comprise a width of about 1 um to about 20 um. The heating element 30 doping (e.g., N-type dopants, P-type dopants, etc.) may be on the order of $10^{18}/cm^{-3}$. The heating element 30 may comprise a resistivity of about 0.01 Ohms/cm.

FIG. 1C illustrates the formation of a deep trenches 24a and 24b and shallow trenches 24c . . . 24f in accordance with embodiments of thc present invention. The deep trenches 24a and 24b amid the shallow trenches 24c . . . 24f may be formed by any trench formation method known to a person of ordinary skill in the art including, inter alai, a reactive ion etch. The deep trenches 24a and 24b and the shallow trenches 24c . . . 24f are typically formed during different processes at different times. The deep trenches 24a and 24b are use to form heating element contacts 6 in FIG. 3. The shallow trenches 24c . . . 24f are use to form shallow trench isolation 4 (STI) in FIG. 3 for electrical devices 22a, 22b, and 22c formed from the device layer 5.

FIG. 1D illustrates the formation of heating element contacts 6 and side wall spacers 4 (i.e., STI), in accordance with embodiments of the present invention. The heating element contacts 6 may be formed by any standard substrate contact processing method known to a person of ordinary skill in the art. The heating element contacts 6 illustrated in FIG. 1D are shown electrically coupled to opposite ends of the heating element 30. Alternatively, heating element contacts 6 may overlap portions of the heating element 30. The heating element contacts 6 may comprise any electrically conductive material such as, inter alia, doped polysilicon. The side wall spacers 4 (i.e., STI) may be formed by any STI processing method known to a person of ordinary skill in the art. The side wall spacers 4 may comprise, inter alia, silicon dioxide.

FIG. 1E illustrates the formed semiconductor structure 2 comprising the heating element 30 and a power supply circuit 3, in accordance with embodiments of the present invention. The semiconductor structure 2 is formed from the semiconductor substrate 7 and comprises the bulk layer 20, the heating element 30, the insulator layer 12 over the heating element 30, the device layer 5, and heating element contacts 6. The device layer 5 may comprise active silicon. The device layer 5 may comprise electrical devices 22a, 22b, and 22c separated by sidewall spacers 4 (e.g., shallow trench isolation). The electrical devices 22a, 22b, and 22c may be, inter alia, transistors, resistors, capacitors, etc. The semiconductor structure 2 may be a CMOS silicon on insulator (SOI) semiconductor structure. The sidewall spacers 4 comprise an electrically insulative material. The insulator layer 12 may comprise, inter alia, silicon dioxide, a thermally insulative nitride, an organic insulating material, etc. The insulator layer 12 comprising silicon dioxide may be, inter alia, a buried oxide layer (BOX), etc. The semiconductor structure 2 may be any semiconductor structure known to a person of ordinary skill in the art such as, inter alia, a semiconductor chip, an integrated circuit, etc. The semiconductor structure 2 may be used (operated) in any type of circuitry. An unwanted electrical charge (e.g., trapped holes) buildup in the insulator layer 12 may be caused when operating the semiconductor structure 2 within circuits in certain environments. For example, when the semiconductor structure 2 is operated in circuitry in a radiation environment (e.g., satellite circuitry, circuitry in a nuclear power plant, etc.), radiation (e.g., from a solar burst, from nuclear power plant facilities, etc) may cause a trapped electrical charge (e.g., trapped holes) to form in the insulator layer 12. The trapped electrical charge in the insulator layer 12 may cause the semiconductor structure 2 to malfunction and ultimately fail. The heating element 30 may be selectively activated (i.e., turned on at an appropriate time) to generate thermal energy to apply heat to the insulator layer 12. The thermal energy will anneal the trapped electrical charge (e.g., trapped holes) from the insulator layer 12. A voltage may be applied to the heating element contacts 6 to activate the heating element 30. The voltage for activating the heating element 30 may be supplied by an internal power supply 3 within the semiconductor structure 2. Alternatively, the voltage for activating the heating element 30 may be supplied by an external (i.e., to the semiconductor structure 2) power supply. The voltage for activating the heating element 30 may be about 5 volts. The heating element 30 may comprise, inter alia, a resistor, a diffusion resistor, etc. The heating element 30 may be periodically activated during operation of the semiconductor structure 2 in certain environments (e.g., a radiation environment) to anneal trapped electrical charge buildup from the insulator layer 12. Alternatively, electrical charge buildup in the insulator layer 12 may be monitored (e.g., by monitoring circuitry on the semiconductor structure 2) and the heating element 30 may be activated when a specified amount of electrical charge buildup is detected. (by monitoring circuitry with in power supply 3). The power supply 3 may additionally comprise a control circuit 3 for controlling activation of the heating element 30. As another alternative, the heating element 30 may be activated continuously (continuous voltage applied) so that the insulator layer 12 will maintain a specific temperature that will limit the amount of trapped electrical charge buildup formation in the insulator layer 12.

Figure 2:
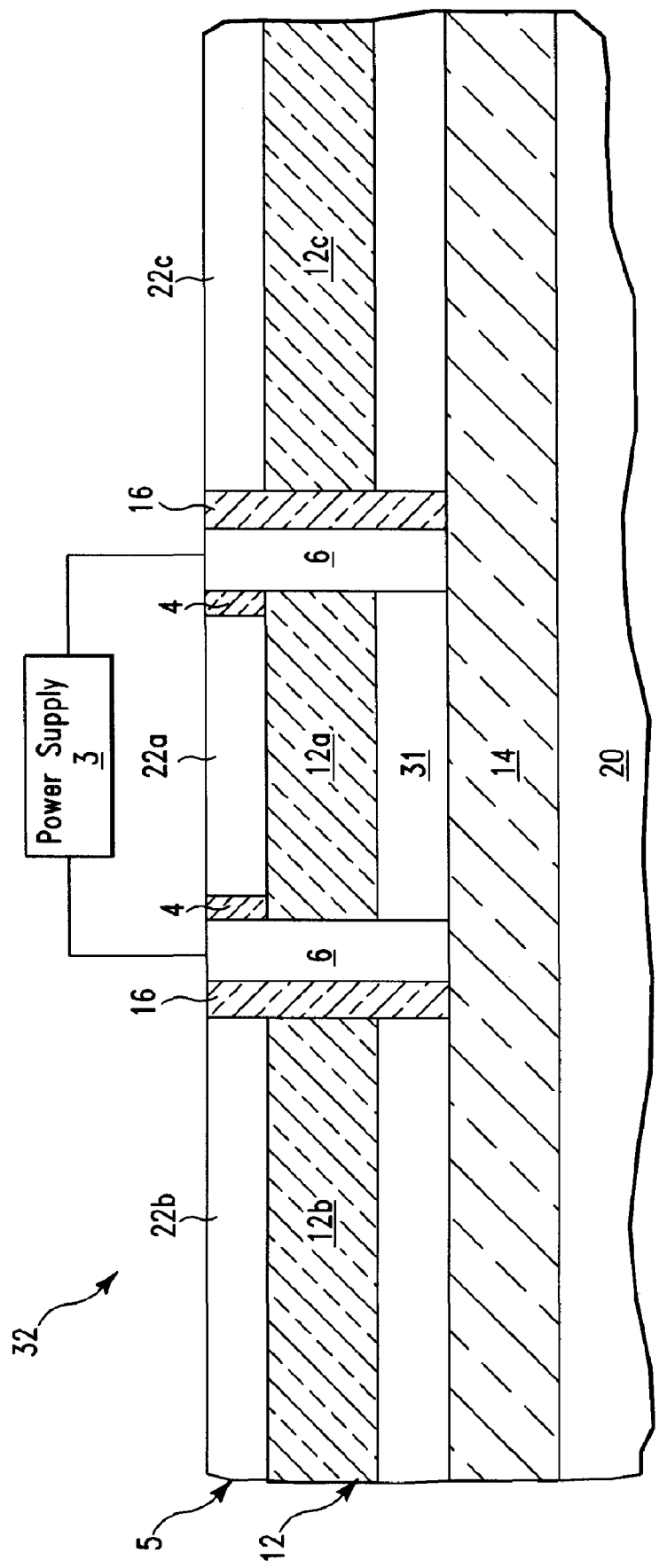
FIG. 2 illustrates an alternative to the semiconductor structure of FIG. 1E showing a semiconductor structure comprising an alternative heating element, in accordance with embodiments of the present invention.

FIG. 2 illustrates a cross sectional view of an alternative to the semiconductor structure 2 of FIG. 1E showing a semiconductor structure 32 comprising an alternative heating element 31, in accordance with embodiments of the present invention. In contrast with the semiconductor structure 2 FIG. 1, the semiconductor structure 32 of FIG. 2 comprises a thermal insulating layer 14 and an isolation structure 16. Additionally, the heating element 31 provides thermal energy to only a portion 12a of the insulator layer 12. The thermal insulating layer 14 may be formed by performing a high energy oxide implant into the bulk layer 20 below the heating element 31. The isolation structure 16 may be formed by performing a reactive ion etch to form a trench (e.g., trenches 24c . . . 24f in FIG. 1C) for the isolation structure 16 and filling the trench with oxide, using a CVD deposition process. The isolation structure 16 illustrated in FIG. 2 is a cross sectional view. The isolation structure 16 surrounds four sides of the heating element 30. The thermal insulating layer 14 and isolation structure 16 each comprise a thermal conductivity that is less than a thermal conductivity of the bulk layer 20. During heater element 31 operation, the thermal insulating layer 14 and isolation structure 16 surrounds the heater element 31 and thermally separates the heater element 31 from the bulk layer 20. Therefore due to the thermal conductivity properties of the thermal insulating layer 14 and isolation structure 16, the bulk layer 20 is thermally isolated from the heating element 31 and thermal energy from the heating element 31 is forced to the portion 12a of the insulator layer 12 to anneal a trapped electrical charge from the portion 12a of the insulator layer 12. The thermal insulating layer 14 and isolation structure 16 cause the heating element 31 to operate more efficiently (i.e., than heating element 30 in FIG. 1) by reducing an amount of power necessary for operating the heating element 31 to heat the portion 12a of the insulator layer 12. The isolation structure 16 may be a deep trench isolation structure. The isolation structure 16 may comprise, inter alia, silicon dioxide, a thermally insulative nitride, an organic insulating material, etc. The thermal insulating layer 14 may comprise, inter alia, silicon dioxide, a thermally insulative nitride, an organic insulating material, etc. The heating element 31 may comprise, inter alia, a resistor, a diffusion resistor, etc.

Figure 3:
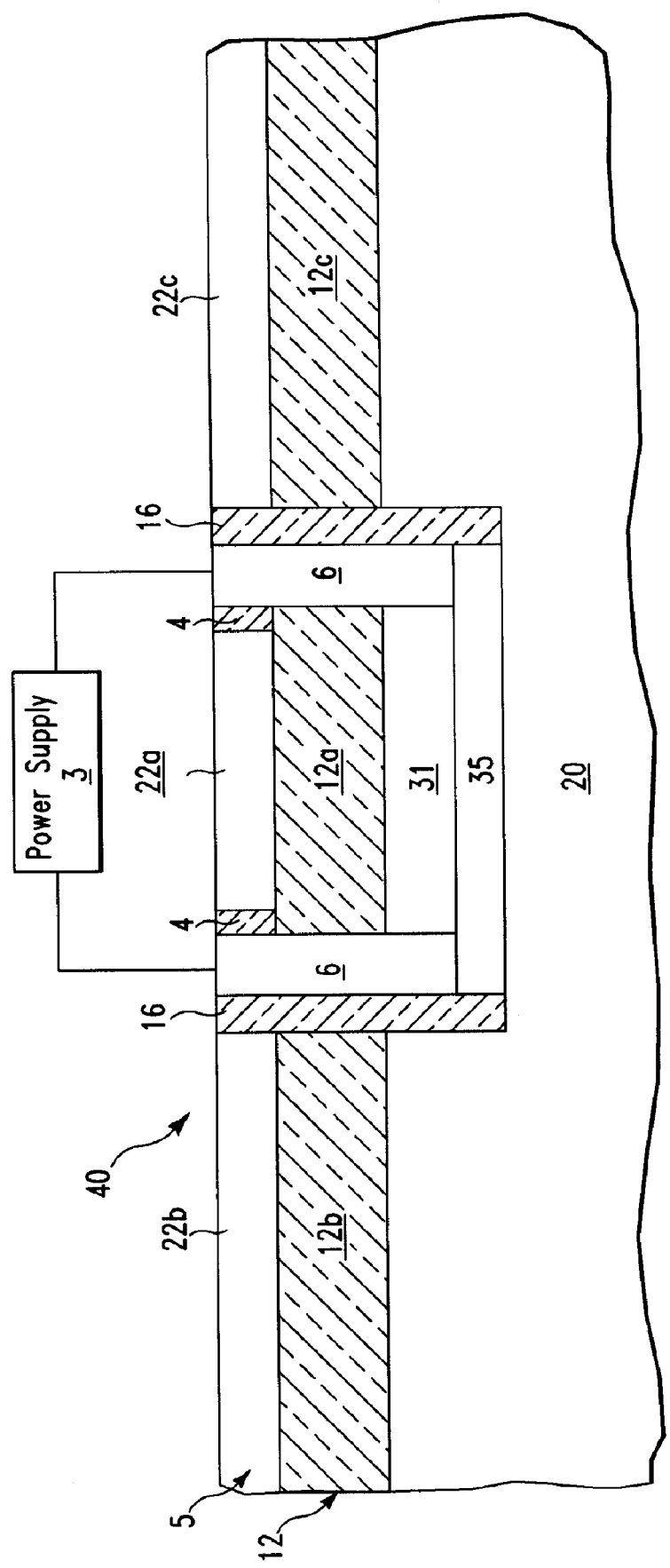
FIG. 3 illustrates a first alternative to the semiconductor structure of FIG. 2, in accordance with embodiments of the present invention.

FIG. 3 illustrates a cross sectional view of a first alternative to the semiconductor structure 32 of FIG. 2 showing a semiconductor structure 40, in accordance with embodiments of the present invention. In contrast with the semiconductor structure 32 FIG. 2, the semiconductor structure 40 of FIG. 3 comprises an air gap 35 instead of the thermal insulating layer 14 of FIG. 2. The air gap 35 is formed in the bulk layer 20. The air gap 35 may be formed by implanting phosphorus in the bulk layer 20 in an area below the heating element 31 (before forming the heating element 31), performing a reactive ion etch to form a trench down to the area below the heating element 31 to become the air-gap 35, and removing the heavily phosphorus-doped area with a wet etch, thereby creating the air-gap 35. During heater element 31 operation, the air gap 35 and isolation structure 16 surround the heater element 31 and thermally separate the heater element 31 from the bulk layer 20. Therefore due to the thermal conductivity properties of the air gap 35 and isolation structure 16, the bulk layer 20 is thermally isolated from the heating element 31 and thermal energy from the heating element 31 is forced to the portion 12a of the insulator layer 12 to anneal a trapped electrical charge from the portion 12a of the insulator layer 12. The air gap 35 and isolation structure 16 cause the heating element 31 to operate more efficiently (i.e., than heating element 30 in FIG. 1) by reducing an amount of power necessary for operating the heating element 31 to heat the portion 12a of the insulator layer 12.

Figure 4:
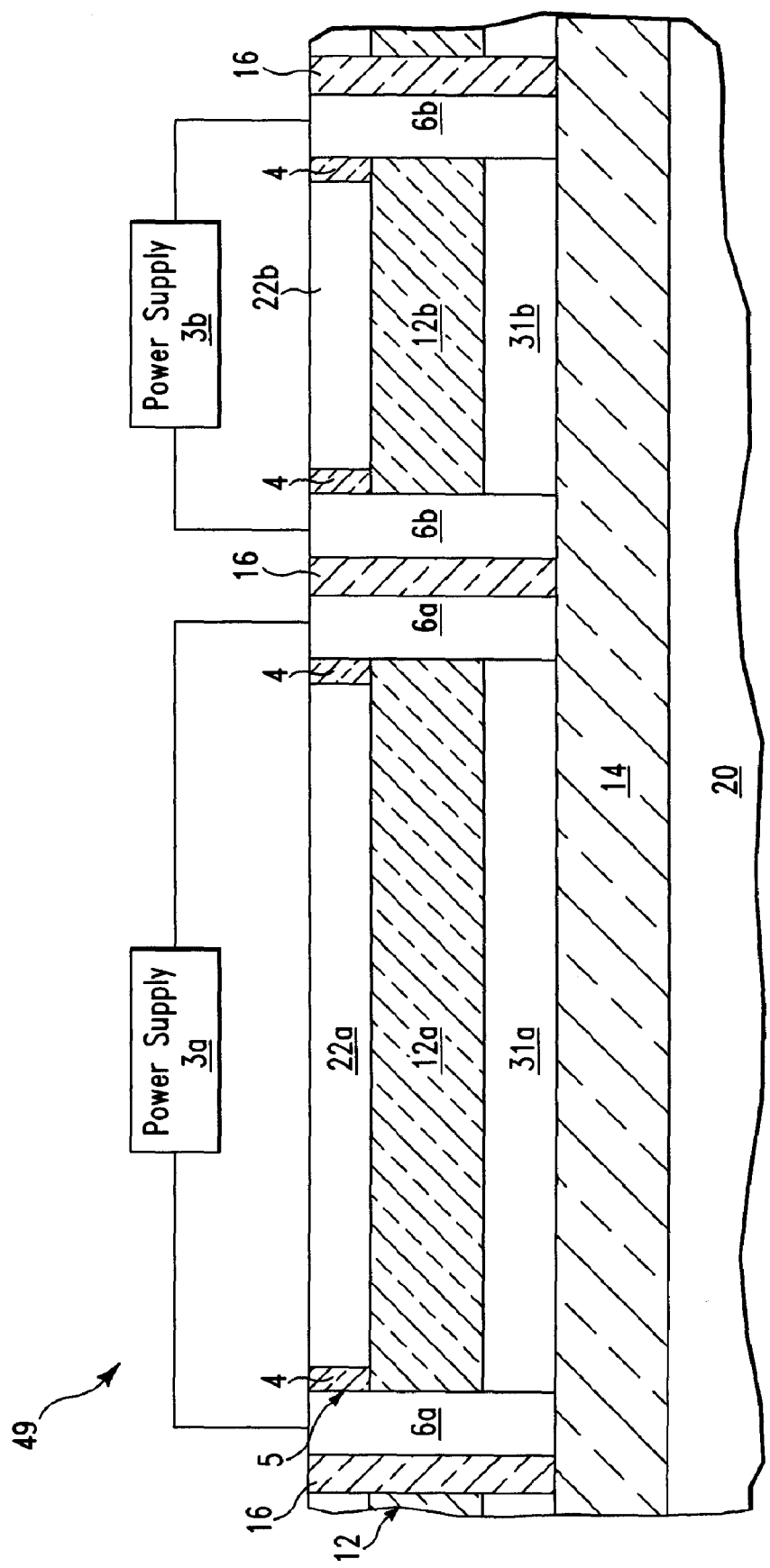
FIG. 4 illustrates a second alternative to the semiconductor structure of FIG. 2, in accordance with embodiments of the present invention.

FIG. 4 illustrates a cross sectional view of a second alternative to the semiconductor structure 32 of FIG. 2 showing a semiconductor structure 49, in accordance with embodiments of the present invention. In contrast with the semiconductor structure 32 FIG. 2, the semiconductor structure 49 or FIG. 4 comprises heating elements 31a and 31b and two isolation structures and 16 each placed surrounding four sides of heating elements 31a and 31b. Alternatively, one isolation structure may be placed surrounding three sides of each of heating elements 31a and 31b. The heating element 31a is located below a portion 12a of the insulator layer 12. The heating element 31b is located below a portion 12b of the insulator layer 12. The isolation structures 16 thermally isolate the heating element 31a from the heating element 31b. The heating elements 31a and 31b may each comprise, inter alia, a resistor, a diffusion resistor, etc. The heating elements 31a and 31b may be periodically activated at a same time during operation of the semiconductor structure 49 in certain environments (e.g., a radiation environment) to anneal trapped electrical charge buildup from portions 12a and 12b of the insulator layer 12. Alternatively, the heating elements 31a and 31b may be periodically activated at a different times during operation of tie semiconductor structure 2 in certain environments (e.g., a radiation environment) to anneal trapped electrical charge buildup from portions 12a and 12b of the insulator layer 12. Additionally, electrical charge buildup in portions 12a and 12b of the insulator layer 12 may be monitored (e.g., by monitoring circuitry on the semiconductor structure 2) and the heating elements 31a and 31b may be activated (i.e., by power supplies 3a and 3b) when a specified amount of electrical charge buildup is detected in portions 12a and 12b (by monitoring circuitry). The heating elements 31a and 31b may be multiplexed so that the heating elements 31a and 31b may each be selectively activated at different times. As another alternative, the heating elements 31a and 31b may be activated continuously so that the portions 12a and 12b of insulator layer 12 will maintain a temperature that will limit the amount of trapped electrical charge buildup formation in portions 12a and 12b of the insulator layer 12.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure comprising:
a substrate comprising a bulk layer, an insulator layer and a device layer;
a first heating element formed within the bulk layer, wherein a first side of the first heating element is adjacent to a first portion of the insulator layer, and wherein the first heating element is adjusted to he selectively activated to generate thermal energy to heat said first portion of the insulator layer and anneal a trapped electrical charge from said first portion of the insulator layer;
a thermal insulating layer formed within the bulk layer and adjacent to a second side of said first heating element, wherein the thermal insulating layer comprises a thermal conductivity that is less than a thermal conductivity of said bulk layer, and wherein the thermal insulating layer is adapted to thermally isolate the second side of the first heating element from the bulk layer; and
a thermal isolation structure formed surrounding a third side, a fourth side, a fifth side, and a sixth side of said first heating element, wherein the thermal isolation structure thermally isolates the third side, the fourth side, the fifth side, and the sixth side of the first heating element from the bulk layer.

2. The semiconductor structure of claim 1, wherein the insulator layer comprises a material selected from the group consisting of silicon dioxide, a thermally insulative nitride, and an organic insulating material.

3. The semiconductor structure of claim 1, wherein the thermal insulating layer comprises a material selected from the group consisting of silicon dioxide, a thermally insulative nitride, and an air gap.

4. The semiconductor structure of claim 1, wherein the first heating element comprises a resistor.

5. The semiconductor structure of claim 4, wherein the resistor comprises implanted ions.

6. The semiconductor structure of claim 1, further comprising a first heating element contact structure and a second heating element contact structure, wherein said first heating element contact structure is electrically connected to a first portion of the first heating element, wherein said second heating element contact structure is electrically connected to a second portion of the first heating element, and wherein the first heating element contact structure and the second heating element contact structure electrically connect the first heating element to a power supply.

7. The semiconductor structure of claim 6, wherein each of the first heating element contact structure and the second heating element contact structure comprise doped polysilicon.

8. The semiconductor structure of claim 1, wherein said bulk layer comprises crystalline silicon.

9. The semiconductor structure of claim 1, wherein said first heating element comprises a length of about 1 um to about 10 um.

10. A semiconductor structure comprising:
a substrate comprising a bulk layer, an insulator layer and a device layer;
a first heating element formed within the bulk layer, wherein a first side of the first heating element is adjacent to a first portion or the insulator layer, and wherein the first heating element is adapted to be selectively activated to generate thermal energy to heat said first portion of the insulator layer and anneal a trapped electrical charge from said first portion of thc insulator layer; and
a second heating element formed within the bulk layer, wherein the device layer comprises a first electrical component and a second electrical component, wherein the first heating element is below the first electrical component, wherein the second heating element is below the second electrical component, wherein a first side of the second heating element is adjacent to a second portion of the insulator layer, wherein the second heating element is adapted to be selectively activated to generate thermal energy to heat said second portion of the insulator layer and anneal a trapped electrical charge from said second portion of the insulator layer.

11. The semiconductor structure of claim 10, further comprising a control circuit adapted to selectively activate the first heating element and the second heating element at different times.

12. The semiconductor structure of claim 10, further comprising a thermal insulating layer located adjacent to a second side of said first heating element and a second side of said second heating element, wherein the thermal insulating layer comprises a thermal conductivity that is less than a thermal conductivity of said bulk layer, and wherein the thermal insulating layer is adapted to thermally isolate the second side of the first heating element and the second side of the second heating element from the bulk layer.

13. The semiconductor structure of claim 12, further comprising:
a first thermal isolation structure formed surrounding a third side, a fourth side, a fifth side, and a sixth side of said first heating element; and a second thermal isolation structure formed surrounding a third side, a fourth side, a fifth side, and a sixth side of said second heating element, wherein the first thermal isolation structure is adapted to thermally isolate the third side, the fourth side, the fifth side, and the sixth side of the first heating element from the bulk layer, and wherein the second thermal isolation structure is adapted to thermally isolate the third side, the fourth side, the fifth side, and the sixth side of the second heating element from the bulk layer.

14. The semiconductor structure of claim 12, further comprising:
a thermal isolation structure formed surrounding a third side, a fourth side, and a fifth side of said first heating element and said second heating element; wherein the thermal isolation structure is adapted to thermally isolate the third side, the fourth side, and the fifth side of the first heating element and said second heating element from the bulk layer.

15. A method for forming a semiconductor structure comprising:
providing a substrate;
forming within the substrate, a bulk layer, an insulator layer and a device layer;
forming a first heating element within the bulk layer, wherein a first side of the first heating element is adjacent to a first portion of the insulator layer, and wherein the first heating element is adapted to be selectively activated to generate thermal energy to heat said first portion of the insulator layer and anneal a trapped electrical charge from said first portion of the insulator layer;
forming within the bulk layer and adjacent to a second side of said first heating element, a thermal insulating layer for thermally isolating the second side of the first heating element from the bulk layer, wherein the thermal insulating layer comprises a thermal conductivity that is less than a thermal conductivity of said semiconductor substrate, and wherein the thermal insulating layer thermally isolates the second side of said first heating element from the bulk layer; and
forming within the substrate a thermal isolation structure surrounding a third side, a fourth side, a fifth side, and a sixth side of said first heating element for thermally isolating the third side, the fourth side, the fifth side, and the sixth side of tie first heating element from the bulk layer.

16. The method of claim 15, wherein the insulator layer comprises a material selected from the group consisting of silicon dioxide, a thermally insulative nitride, and in organic insulating material.

17. The method of claim 15, wherein the thermal insulating layer comprises a material selected from the group consisting of silicon dioxide, a thermally insulative nitride, and an air gap.

18. The method of claim 15, wherein the first heating element comprises a resistor.

19. The method of claim 18, further comprising forming the resistor by implanting ion implants into a portion of the bulk layer.

20. The method of claim 19, wherein said ion implants are selected from the group consisting of N-type dopants and P-type dopants.

21. The method of claim 15, wherein said bulk layer comprises crystalline silicon.

22. The method of claim 15, wherein said first heating element comprises a length of about 1 um to about 10 um.

23. A method for forming a semiconductor structure comprising:
providing a substrate;
forming within the substrate, a bulk layer, an insulator layer and a device layer;
forming a first heating element within the bulk layer, wherein a first side of the first heating element is adjacent to a first portion of the insulator layer, and wherein the first heating element is adapted to be selectively activated to generate thermal energy to heat said first portion of the insulator layer and anneal a trapped electrical charge from said first portion of the insulator layer;
forming within the device layer, a first electrical component and a second electrical component; and
forming a second heating element within the bulk layer, wherein a first side of the second heating element is adjacent to the first portion of the insulator layer, wherein the first heating element is below the first electrical component, wherein the second heating element is below the second electrical component, and wherein the second heating element is adapted to be selectively activated to generate thermal energy to heat said second portion of the insulator layer and anneal a trapped electrical charge from said second portion of the insulator layer.

24. The method of claim 23, further comprising:
forming a control circuit within the semiconductor structure for selectively activating by, the first heating element and the second heating element at different times.

25. The method of claim 23, further comprising:
forming within the bulk layer and adjacent to a second side of said first heating element and a second side of said second heating element, a thermal insulating layer for thermally isolating the second side of said first heating element and the second side of said second heating element, wherein the thermal insulating layer comprises a thermal conductivity that is less than a thermal conductivity of said semiconductor substrate, and wherein the thermal insulating layer thermally isolates the second side of said first heating element and the second side of said second heating element from the bulk layer.

26. The method of claim 25, further comprising:
forming within the substrate, a first thermal isolation structure surrounding a third side, a fourth side, a fifth side, and a sixth side of said first heating element for thermally isolating the third side, the fourth side, the fifth side, and the sixth side of the first heating element from the bulk layer; and forming within the substrate, a second thermal isolation structure surrounding a third side, a fourth side, a fifth side, and a sixth side of said second heating element for thermally isolating the third side, the fourth side, the fifth side, and the sixth side of the second heating element from the bulk layer.

27. The method of claim 25, further comprising forming a thermal isolation structure surrounding a third side, a fourth side, and a fifth side of said first heating element and said second heating element for thermally isolating the third side, the fourth side, and the fifth side of the first heating element and said second heating element from the bulk layer.

28. A method for forming a semiconductor structure comprising:

providing a substrate;

forming within the substrate a bulk layer, an insulator layer and a device layer;

forming a first heating element within the bulk layer, wherein a first side of the first heating element is adjacent to a first portion of the insulator layer, and wherein the first heating element is adapted to be selectively activated to generate thermal energy to heat said first portion of the insulator layer and anneal a trapped electrical charge from said first portion of the insulator layer;

forming a first heating element contact structure electrically connected to a first portion of the first heating element; and forming a second heating element contact structure electrically connected to a second portion of the first heating element, wherein the first heating element contact structure and the second heating element contact structure electrically connect the first heating element to a power supply.

29. The method of claim 28, wherein each of the first heating element contact structure and the second heating element contact structure comprise doped polysilicon.

* * * * *

UNITED STATES PATENT AND TRADEMARK OFFICE
CERTIFICATE OF CORRECTION

PATENT NO. : 7,064,414 B2  Page 1 of 1
APPLICATION NO. : 10/904483
DATED : June 20, 2006
INVENTOR(S) : Aitken et al.

It is certified that error appears in the above-identified patent and that said Letters Patent is hereby corrected as shown below:

Column 2
Line 43, delete "of a deep" and insert -- of deep --

Column 5
Line 11, delete "and two isolation structures and" and insert -- and isolation structure --
Line 58, delete "adjusted to he" and insert -- adjusted to be --

Column 6
Line 49, delete "or" and insert -- of --
Line 53, delete "thc" and insert -- the --

Column 7
Line 66, delete "tie" and insert -- the --

Column 8
Line 38, delete "thc" and insert -- the --

Signed and Sealed this

Second Day of September, 2008

JON W. DUDAS
*Director of the United States Patent and Trademark Office*